(12) United States Patent
Watanabe et al.

(10) Patent No.: US 10,520,311 B2
(45) Date of Patent: Dec. 31, 2019

(54) GYRO SENSOR APPARATUS

(71) Applicant: DENSO CORPORATION, Kariya, Aichi-pref. (JP)

(72) Inventors: Takamoto Watanabe, Kariya (JP); Shigenori Yamauchi, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 232 days.

(21) Appl. No.: 15/600,504

(22) Filed: May 19, 2017

(65) Prior Publication Data

US 2017/0336206 A1  Nov. 23, 2017

(30) Foreign Application Priority Data

May 20, 2016  (JP) ................................ 2016-101565

(51) Int. Cl.
| | | |
|---|---|---|
| G01C 19/56 | (2012.01) | |
| G01C 19/06 | (2006.01) | |
| G01C 19/5719 | (2012.01) | |
| G01C 19/5776 | (2012.01) | |
| H03K 5/00 | (2006.01) | |

(52) U.S. Cl.
CPC ........... *G01C 19/56* (2013.01); *G01C 19/065* (2013.01); *G01C 19/5719* (2013.01); *G01C 19/5776* (2013.01); *H03K 2005/00013* (2013.01); *H03K 2005/00058* (2013.01)

(58) Field of Classification Search
CPC .. G01C 19/065; G01C 19/56; G01C 19/5614; G01C 19/5719; G01C 19/5776; H03K 2005/00013; H03K 2005/00058

USPC .......................................... 73/504.02, 504.12
See application file for complete search history.

(56) References Cited

U.S. PATENT DOCUMENTS

| 5,451,828 A | 9/1995 | Tomikawa et al. |
|---|---|---|
| 5,465,620 A * | 11/1995 | Sanderson ......... G01C 19/5719 73/504.12 |
| 2002/0073778 A1 | 6/2002 | Fujimoto et al. |
| 2003/0039325 A1 * | 2/2003 | Watanabe .......... G01C 19/5649 375/346 |

(Continued)

FOREIGN PATENT DOCUMENTS

| JP | H05-259907 A | 10/1993 |
|---|---|---|
| JP | H08-313265 | 11/1996 |

(Continued)

*Primary Examiner* — Benjamin R Schmitt
(74) *Attorney, Agent, or Firm* — Knobbe, Martens, Olson & Bear, LLP (57) ABSTRACT

A gyro sensor apparatus includes a driving section that supplies a driving signal, which is for vibrating a sensing element of a vibration-type gyro sensor in a drive axis direction, to the sensing element, and a processing unit that receives a first vibration signal having an amplitude proportional to a driving vibration amplitude, which is an amplitude of vibration in the drive axis direction of the sensing element and a second vibration signal having an amplitude proportional to Coriolis force generated in the sensing element due to an angular velocity of the sensing element. The processing unit is configured to calculate a ratio of Coriolis force to the driving vibration amplitude based on the first vibration signal and the second vibration signal and output a result of the calculation as a result of detection of the angular velocity of the sensing element.

1 Claim, 5 Drawing Sheets

(56) References Cited

U.S. PATENT DOCUMENTS

2005/0241395 A1 11/2005 Takahashi et al.
2015/0160012 A1 6/2015 Ii et al.

FOREIGN PATENT DOCUMENTS

| JP | H09-033259 | 2/1997 |
| JP | H09-33259 A | 2/1997 |
| JP | 2000-292172 | 10/2000 |
| JP | 2003-130646 | 5/2003 |
| JP | 2011-137777 A | 7/2011 |
| JP | 2015-052484 A | 3/2015 |
| JP | 2005-102129 A | 4/2015 |

* cited by examiner

GYRO SENSOR APPARATUS

CROSS-REFERENCE TO RELATED APPLICATION

This application is based on and claims the benefit of priority from earlier Japanese Patent Application No. 2016-101565 filed May 20, 2016, the description of which is incorporated herein by reference.

BACKGROUND

Technical Field

The present disclosure relates to a gyro sensor apparatus.

Related Art

As a gyro sensor apparatus that detects an angular velocity by using a vibration-type gyro sensor, for example, an apparatus is disclosed in JP-A-9-33259. The apparatus disclosed in JP-A-9-33259 includes a phase shift circuit with a temperature compensation circuit, as a circuit providing a driving signal to a piezoelectric element serving as a sensing element. The phase shift circuit with a temperature compensation circuit controls the driving signal to the piezoelectric element so that output voltage of the piezoelectric element becomes constant all the time regardless of the temperature change.

In a vibration-type gyro sensor, a sensing element for detecting an angular velocity vibrates in the drive axis direction by receiving a driving signal. The vibration in the drive axis direction of the sensing element is referred to as driving vibration. The amplitude of the driving vibration is referred to as a driving vibration amplitude. When the sensing element vibrating in the drive axis direction rotates around a rotation axis in the direction orthogonal to the drive axis direction, that is, when an angular velocity is generated in the sensing element, Coriolis force is generated in the detection axis direction orthogonal to both of the drive axis direction and the rotation axis. The Coriolis force causes vibration of the sensing element in the detection axis direction. The vibration in the detection axis direction of the sensing element is referred to as detection vibration. The amplitude of the detection vibration is referred to as a detection vibration amplitude.

The detection vibration amplitude is proportional to Coriolis force, and the Coriolis force is proportional to a velocity of driving vibration (hereinafter, referred to as a driving vibration velocity) and an angular velocity. The driving vibration amplitude is proportional to the driving vibration velocity.

Thus, in the gyro sensor apparatus disclosed in JP-A-9-33259, it is assumed that the driving vibration velocity becomes always constant by performing feedback control for adjusting a driving signal so that the driving vibration amplitude becomes constant. Thereby, it is assumed that the detection vibration amplitude always indicates a true angular velocity. Then, by electrically detecting the detection vibration amplitude, an angular velocity is detected.

The gyro sensor apparatus described above has the following problems (1) to (3).

(1) To perform feedback control for making a driving vibration amplitude constant, for example, at least a comparison circuit and an AGC circuit are required. The comparison circuit compares an actual driving vibration amplitude with a target value in real time. The AGC circuit adjusts a driving signal to the sensing element according to a comparison result of the comparison circuit. Since the comparison circuit and the AGC circuit are large in size, the gyro sensor apparatus cannot be decreased in size, which results in increase in power consumption and manufacturing cost. It is noted that AGC is an abbreviation of "automatic gain control". Specifically, in recent IoT application systems, a number of high-accuracy sensors are required. However, since conventional gyro sensor apparatuses cannot meet requirements for decrease in size, it is difficult to apply them to IoT application systems. It is noted that IoT is an abbreviation of "Internet-of-Things".

(2) In the feedback control for making a driving vibration amplitude constant, variation in detection sensitivity cannot be corrected. When a resonance frequency of the sensing element changes due to temperature, time passage, or the like, a driving vibration velocity changes, thereby the detection sensitivity varies. Thus, it is difficult to apply the conventional gyro sensor apparatus to a system requiring high accuracy, such as an automatic operating system for a vehicle.

(3) Since the driving vibration amplitude is required to be constant, the maximum vibration amplitude of the sensing element cannot be used. That is, since sensing capability of the sensing element is always restricted, an angular velocity cannot be detected with the maximum sensitivity of the sensing element. As a result, to achieve high sensitivity to be targeted, the sensing element is required to be designed so as to have higher sensitivity than necessary, which interrupts the decrease in size and manufacturing cost of the sensing element.

SUMMARY

An embodiment provides a gyro sensor apparatus that can be decreased in size, and increased in accuracy and sensitivity.

As an aspect of the embodiment, a gyro sensor apparatus includes: a driving section that supplies a driving signal, which is for vibrating a sensing element of a vibration-type gyro sensor in a drive axis direction, to the sensing element; and a processing unit that receives a first vibration signal having an amplitude proportional to a driving vibration amplitude, which is an amplitude of vibration in the drive axis direction of the sensing element and a second vibration signal having an amplitude proportional to Coriolis force generated in the sensing element due to an angular velocity of the sensing element, wherein the processing unit is configured to calculate a ratio of Coriolis force to the driving vibration amplitude based on the first vibration signal and the second vibration signal and output a result of the calculation as a result of detection of the angular velocity of the sensing element.

DETAILED DESCRIPTION OF THE PREFERRED EMBODIMENTS

Hereinafter, embodiments are described with reference to the drawings.

1. First Embodiment

1-1. Configuration

Figure 1:
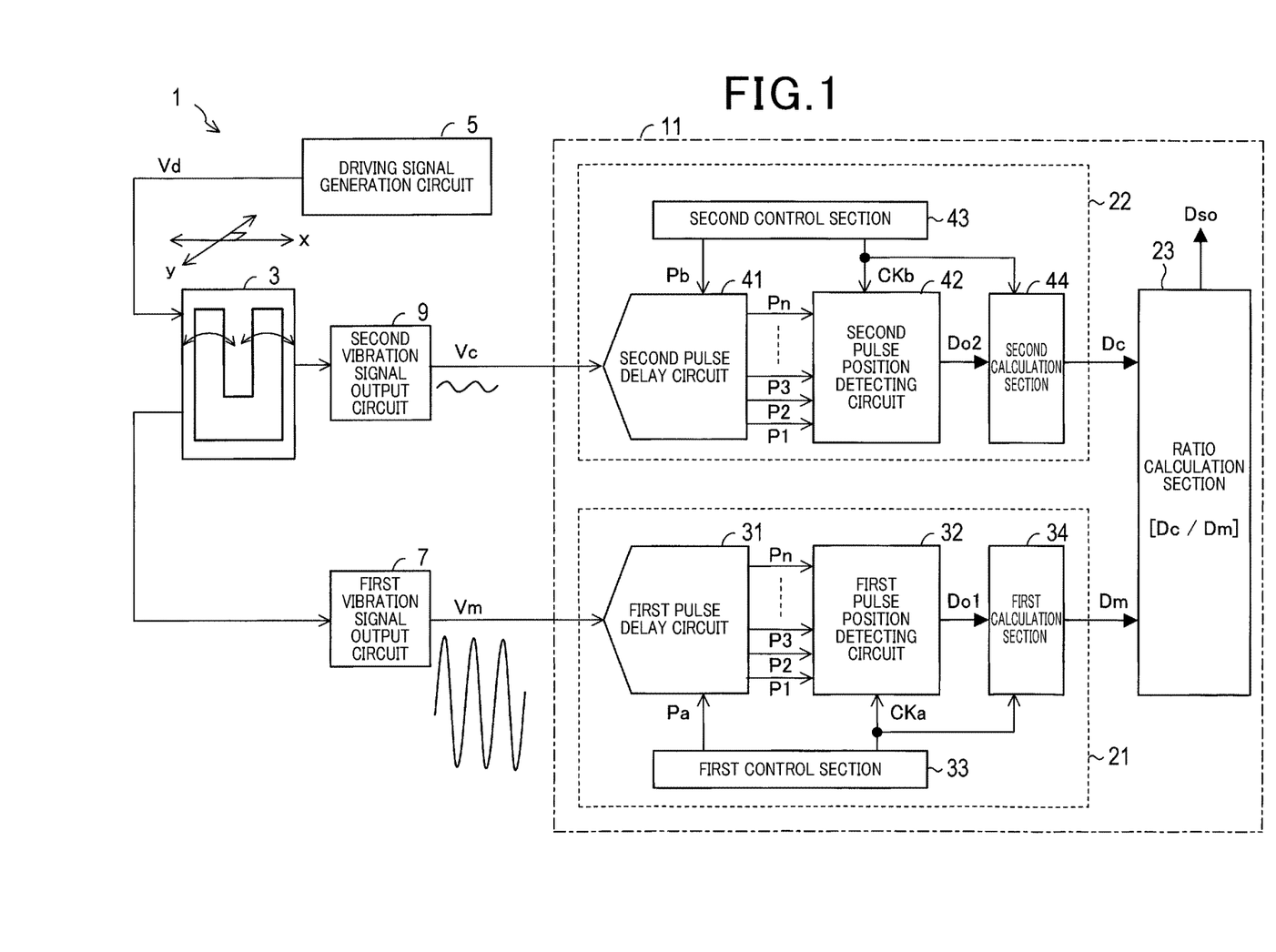
FIG. 1 is a block diagram showing a configuration of a gyro sensor apparatus according to a first embodiment.

A gyro sensor apparatus 1 of the first embodiment shown in FIG. 1 is installed in a vehicle such as a passenger automobile. The gyro sensor apparatus 1 includes a sensing element (hereinafter, referred to as an element) 3 of a vibration-type gyro sensor and a driving signal generation circuit 5.

The element 3 is, for example, a tuning fork type element. The element 3 vibrates in the drive axis direction by receiving a driving signal Vd having a predetermined frequency output from the driving signal generation circuit 5. The vibration in the drive axis direction is driving vibration. In the present embodiment, the horizontal direction in FIG. 1 is defined as an x axis direction, which is the drive axis direction.

When the element 3 vibrating in the drive axis direction rotates around a rotation axis in the direction orthogonal to the drive axis direction, that is, when an angular velocity is generated in the element 3, Coriolis force fc is generated in the detection axis direction orthogonal to both the drive axis direction and the rotation axis. In the present embodiment, the front-back direction in FIG. 1 is defined as a y axis direction, which is the detection axis direction.

The Coriolis force fc is proportional to a driving vibration velocity and an angular velocity of the element 3. Since a driving vibration amplitude is proportional to the driving vibration velocity, the Coriolis force fc is proportional to the driving vibration amplitude and the angular velocity of the element 3. The Coriolis force fc causes vibration in the detection axis direction (i.e. detection vibration). In addition, the detection vibration amplitude is proportional to the Coriolis force fc.

In addition, the gyro sensor apparatus 1 includes a first vibration signal output circuit 7 and a second vibration signal output circuit 9.

In a monitoring electrode (electrode for monitoring) of the element 3, charge changes depending on driving vibration. The first vibration signal output circuit 7 converts the change of charge in the monitoring electrode to a voltage signal to output a first vibration signal Vm. The first vibration signal Vm oscillates with respect to a predetermined oscillation center voltage Vzm higher than 0 V, and has an amplitude proportional to the driving vibration amplitude. The frequency of the first vibration signal Vm is the same as the frequency of the driving signal Vd.

In a detection electrode (electrode for detection) of the element 3, charge changes depending on detection vibration. The second vibration signal output circuit 9 converts the change of charge in the detection electrode to a voltage signal to output a second vibration signal Vc. The second vibration signal Vc oscillates with respect to a predetermined oscillation center voltage Vzc higher than 0 V, and has an amplitude proportional to the detection vibration amplitude. Since the detection vibration amplitude is proportional to the Coriolis force fc, the amplitude of the second vibration signal Vc is proportional to the Coriolis force fc. Hence, the amplitude of the second vibration signal Vc is proportional to a driving vibration amplitude and an angular velocity. The frequency of the second vibration signal Vc is the same as the frequency of the first vibration signal Vm. Phases of the first vibration signal Vm and the second vibration signal Vc are displaced from each other by 90°. It is noted that the oscillation center voltage Vzm of the first vibration signal Vm and the oscillation center voltage Vzc of the second vibration signal Vc may be the same or not the same.

The gyro sensor apparatus 1 includes a processing unit 11. The processing unit 11 receives the first vibration signal Vm and the second vibration signal Vc.

The processing unit 11 calculates a ratio of the Coriolis force fc to the driving vibration amplitude based on the first vibration signal Vm and the second vibration signal Vc, and outputs the result of the calculation as a result of detection of an angular velocity (hereinafter, referred to as an angular velocity detection result) Dso of the element 3.

The processing unit 11 includes, as components for calculating the ratio, a first detection section 21, a second detection section 22, and a ratio calculation section 23.

The first detection section 21 outputs a first detection signal Dm indicating the driving vibration amplitude based on the first vibration signal Vm. The second detection section 22 outputs a second detection signal Dc indicating the Coriolis force fc based on the second vibration signal Vc. In the present embodiment, the first detection signal Dm and the second detection signal Dc are digital signals. The ratio calculation section 23 receives the first detection signal Dm and the second detection signal Dc. Operation of the ratio calculation section 23 will be described later.

The first detection section 21 includes a first pulse delay circuit 31 as a component for outputting the first detection signal Dm. In addition, the first detection section 21 includes a first pulse position detecting circuit 32, a first control section 33, and a first calculation section 34.

Figure 2:
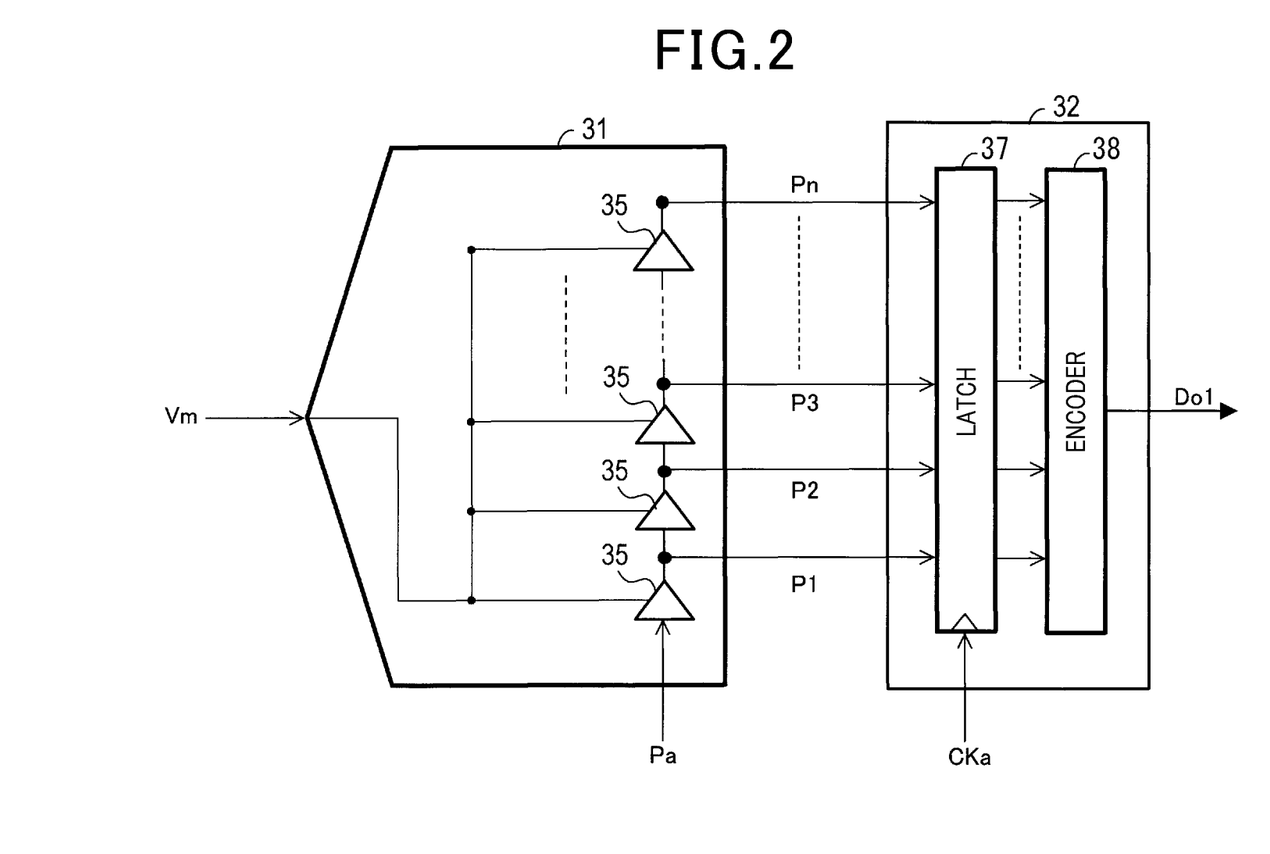
FIG. 2 is a diagram showing configurations of a first pulse delay circuit and a first pulse position detecting circuit.

As shown in FIG. 2, the first pulse delay circuit 31 includes a plurality of delay units 35 configured so that the speed (hereinafter, referred to as pulse propagation speed), at which a received pulse signal (hereinafter, referred to as a pulse) is propagated to the output side, increases in proportion to a voltage value of the first vibration signal Vm. The plurality of delay units 35 are connected in series.

Figure 3:
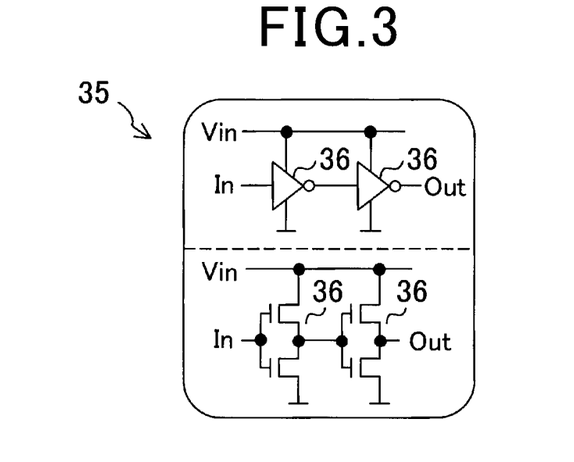
FIG. 3 is a diagram showing a configuration of a delay unit.

Specifically, as shown in FIG. 2 and FIG. 3, each of the n delay units 35 configuring the first pulse delay circuit 31 is formed of two-stage inverter gate circuits 36 connected in series. It is noted that n is an integer of 2 or more. As power Vin of the delay units 35, that is, power yin of the inverter gate circuits 36, the first vibration signal Vm is supplied. Thus, the pulse propagation speed in the delay units 35 is controlled by the first vibration signal Vm. Specifically, the pulse propagation speed in the delay units 35 increases in proportion to a voltage value of the first vibration signal Vm.

The first pulse delay circuit 31 receives a high-level pulse Pa from the outside. The pulse Pa is input to the first-stage delay unit 35 of then delay units 35 configuring the first pulse delay circuit 31. Thus, each of the delay units 35 connected in series outputs the pulse Pa at the timing when the pulse Pa has passed through the delay units 35. Hereinafter, output signals P1 to Pn of the delay units 35 are referred to as a delay pulse group.

In addition, as shown in FIG. 2, the first pulse position detecting circuit 32 includes a latch circuit 37 and an encoder 38.

The first pulse position detecting circuit 32 receives a clock CKa from the outside. Then, the clock CKa is input to the latch circuit 37.

The latch circuit 37 stores information on states of the delay pulse group P1 to Pn from the first pulse delay circuit 31, for example, at the rise timing of the clock CKa. The state of the delay pulse group P1 to Pn is high level or low level.

The encoder 38 outputs a digital signal indicating the number of the delay units 35, through which the pulse Pa has passed, from the state of the delay pulse group P1 to Pn stored in the latch circuit 37. The digital signal output from the encoder 38 becomes an output signal Do1 of the first pulse position detecting circuit 32.

Hence, the digital signal indicating the number of the delay units 35, through which the pulse Pa has passed during a time period from the time when a high-level pulse Pa is input to the first pulse delay circuit 31 to the time when a rising edge is generated in the clock CKa, becomes the output signal Do1 of the first pulse position detecting circuit 32. The output signal Do1 is also a signal obtained by converting an integrated value of the first vibration signal Vm during the time period to a digital value.

The first control section 33 performs at least outputting the pulse Pa to the first pulse delay circuit 31 and outputting the clock CKa to the first pulse position detecting circuit 32. The clock CKa is input also to the first calculation section 34. Then, the first calculation section 34 generates the first detection signal Dm from the output signal Do1 of the first pulse position detecting circuit 32 and outputs the first detection signal Dm. Operations of the first control section 33 and the first calculation section 34 will be described later.

The second detection section 22 includes a second pulse delay circuit 41 as a component for outputting the second detection signal Dc. In addition, the second detection section 22 includes a second pulse position detecting circuit 42, a second control section 43, and a second calculation section 44.

The second pulse delay circuit 41 includes a plurality of delay units configured so that the pulse propagation speed increases in proportion to a voltage value of the second vibration signal Vc. Also in the second pulse delay circuit 41, the plurality of delay units are connected in series. Specifically, although the second pulse delay circuit 41 has the same configuration as that of the first pulse delay circuit 31, the second pulse delay circuit 41 differs from the first pulse delay circuit 31 in that the second vibration signal Vc is supplied as the power Vin of the delay units 35. It is noted that, in FIG. 1, Pb is used as a sign of a pulse input to the second pulse delay circuit 41.

In addition, the second pulse position detecting circuit 42 has the configuration same as that of the first pulse position detecting circuit 32. That is, the second pulse position detecting circuit 42 includes, as in the first pulse position detecting circuit 32, the latch circuit 37 and the encoder 38. It is noted that, as shown in FIG. 1, CKb is used as a sign of a clock input to the second pulse position detecting circuit 42.

Thus, in the second detection section 22, the digital signal indicating the number of the delay units 35, through which the pulse Pb has passed during a time period from the time when a high-level pulse Pb is input to the second pulse delay circuit 41 to the time when a rising edge is generated in the clock CKb, becomes an output signal Do2 of the second pulse position detecting circuit 42.

The second control section 43 performs at least outputting the pulse Pb to the second pulse delay circuit 41 and outputting the clock CKb to the second pulse position detecting circuit 42. The clock CKb is input also to the second calculation section 44. The second calculation section 44 generates the second detection signal Dc from the output signal Do2 of the second pulse position detecting circuit 42 and outputs the second detection signal Dc. Operations of the second control section 43 and the second calculation section 44 will be described later.

1-2. Operation of First Control Section

The timing when the first vibration signal Vm crosses the oscillation center voltage Vzm is referred to as a zero cross timing. Among the zero cross timings, the timing when the first vibration signal Vm crosses the oscillation center voltage Vzm from the bottom to the top is referred to as a high-side zero cross timing. The timing when the first vibration signal Vm crosses the oscillation center voltage Vzm from the top to the bottom is referred to as a low-side zero cross timing. In addition, a half period during which the first vibration signal Vm is larger than the oscillation center voltage Vzm is referred to as a high-side half period. A half period during which the first vibration signal Vm is smaller than the oscillation center voltage Vzm is referred to as a low-side half period. Such terms are similarly used for the second vibration signal Vc.

The first control section 33 performs the following operations <m1> and <m2>.

Figure 4:
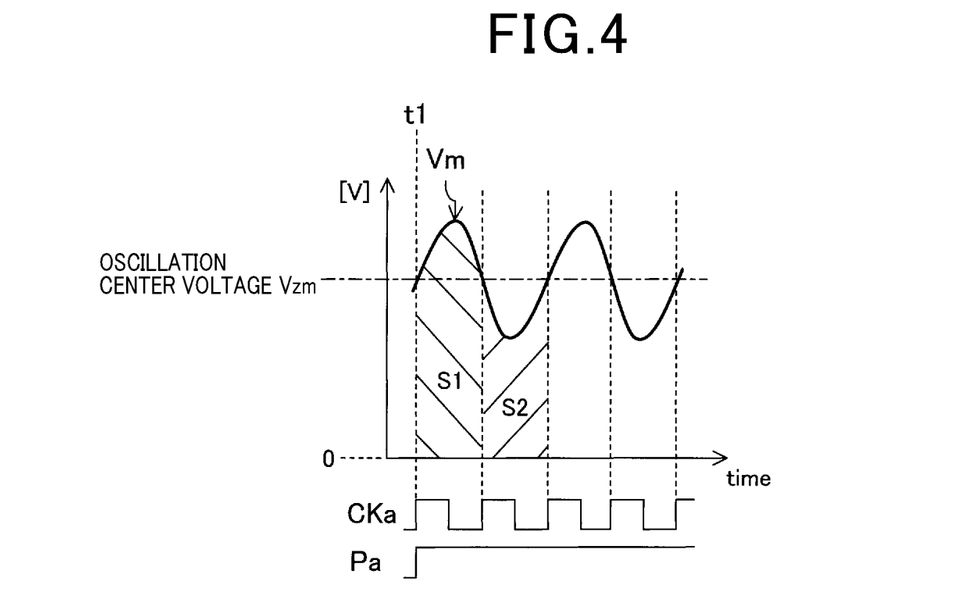
FIG. 4 is a diagram illustrating operation of a first control unit.

<m1> The first control section 33 makes the pulse Pa to the first pulse delay circuit 31 high level at any of the high-side zero cross timings of the first vibration signal Vm as shown at time t1 in FIG. 4. It is noted that the time when the pulse Pa to the first pulse delay circuit 31 becomes high level is referred to as a start time of the pulse Pa.

<m2> Then, as shown in FIG. 4, the first control section 33 outputs the clock CKa to the first pulse position detecting circuit 32 so as to rise at every zero cross timings of the first vibration signal Vm. The first control section 33 specifies the zero cross timings of the first vibration signal Vm based on, for example, the driving signal Vd.

Thus, the first pulse position detecting circuit 32 outputs a digital signals indicating the number of the delay units 35, through which the pulse Pa has passed from the start time of the pulse Pa, as the output signal Do1 at every zero cross timings of the first vibration signal Vm.

1-3. Operation of First Calculation Section

The first calculation section 34 operates in synchronization with the clock CKa and acquires an updated output signal Do1.

The first calculation section 34 calculates a value (hereinafter, Nm1) obtained by subtracting a value of the output signal Do1 updated at the immediately previous high-side zero cross timing of the first vibration signal Vm from a value of the output signal Do1 updated at the low-side zero cross timing. Nm1 is the number of the delay units 35 through which the pulse Pa has passed in the first pulse delay circuit 31 during the high-side half period of the first vibration signal Vm. In addition, as shown in FIG. 4, Nm1 indicates an integrated value S1 during the high-side half period of the first vibration signal Vm.

In addition, the first calculation section 34 calculates a value (hereinafter, Nm2) obtained by subtracting a value of the output signal Do1 updated at the immediately previous low-side zero cross timing of the first vibration signal Vm from a value of the output signal Do1 updated at the high-side zero cross timing. Nm2 is the number of the delay units 35 through which the pulse Pa has passed in the first pulse delay circuit 31 during the low-side half period of the first vibration signal Vm. In addition, as shown in FIG. 4, Nm2 indicates an integrated value S2 during the low-side half period of the first vibration signal Vm.

Then, the first calculation section 34 calculates the difference between the successively calculated Nm1 and Nm2, that is, Nm1−Nm2. The first calculation section 34 outputs a digital signal indicating Nm1−Nm2 as the first detection signal Dm.

The first detection signal Dm generated as described above corresponds to a value obtained by subtracting the integrated value S2 during the low-side half period of the first vibration signal Vm from the integrated value S1 during the high-side half period of the first vibration signal Vm, that is, S1−S2, and indicates the amplitude of the first vibration signal Vm. Thus, the first detection signal Dm indicates the driving vibration amplitude.

1-4. Operation of Second Control Section

The second control section 43 also performs operation similar to that of the first control section 33. That is, the second control section 43 performs the following operations <c1> and <c2>.

<c1> The second control section 43 makes the pulse Pb to the second pulse delay circuit 41 high level at any of the high-side zero cross timings of the second vibration signal Vc. It is noted that the time when the pulse Pb to the second pulse delay circuit 41 becomes high level is referred to as a start time of the pulse Pb.

<c2> Then, the second control section 43 outputs the clock CKb to the second pulse position detecting circuit 42 so as to rise at every zero cross timings of the second vibration signal Vc. The second control section 43 specifies the zero cross timings of the second vibration signal Vc based on, for example, the driving signal Vd or the zero cross timing of the first vibration signal Vm.

Thus, the second pulse position detecting circuit 42 outputs a digital signals indicating the number of the delay units 35, through which the pulse Pb has passed from the start time of the pulse Pb, as the output signal Do2 at every zero cross timings of the second vibration signal Vc.

1-5. Operation of Second Calculation Section

The second calculation section 44 also operates as in the first calculation section 34.

That is, the second calculation section 44 operates in synchronization with the clock CKb and acquires an updated output signal Do2.

Then, the second calculation section 44 calculates a value (hereinafter, Nc1) obtained by subtracting a value of the output signal Do2 updated at the immediately previous high-side zero cross timing of the second vibration signal Vc from a value of the output signal Do2 updated at the low-side zero cross timing. Nc1 is the number of the delay units 35 through which the pulse Pb has passed in the second pulse delay circuit 41 during the high-side half period of the second vibration signal Vc. In addition, Nc1 indicates an integrated value during the high-side half period of the second vibration signal Vc.

In addition, the second calculation section 44 calculates a value (hereinafter, Nc2) obtained by subtracting a value of the output signal Do2 updated at the immediately previous low-side zero cross timing of the second vibration signal Vc from a value of the output signal Do2 updated at the high-side zero cross timing. Nc2 is the number of the delay units 35 through which the pulse Pb has passed in the second pulse delay circuit 41 during the low-side half period of the second vibration signal Vc. In addition, Nc2 indicates an integrated value during the low-side half period of the second vibration signal Vc.

Then, the second calculation section 44 calculates the difference between the successively calculated Nc1 and Nc2, that is, Nc1−Nc2. The second calculation section 44 outputs a digital signal indicating Nc1−Nc2 as the second detection signal Dc.

The second detection signal Dc generated as described above corresponds to a value obtained by subtracting the integrated value during the low-side half period of the second vibration signal Vc from the integrated value during the high-side half period of the second vibration signal Vc, and indicates the amplitude of the second vibration signal Vc. Thus, the second detection signal Dc indicates the Coriolis force fc.

1-6. Operation of Ratio Calculation Section

The ratio calculation section 23 receives the first detection signal Dm from the first detection section 21 and receives the second detection signal Dc from the second detection section 22. Then, the ratio calculation section 23 calculates a ratio of a value of the second detection signal Dc to a value of the first detection signal Dm, that is, Dc/Dm, as a ratio of Coriolis force to the driving vibration amplitude, and outputs the calculated ratio as the angular velocity detection result Dso. The angular velocity detection result Dso output from the ratio calculation section 23 is also a digital signal.

It is noted that part of or all of the ratio calculation section 23, the first control section 33, the first calculation section 34, the second control section 43, and the second calculation section 44 may be configured by, for example, one or more microcomputers or hardware formed of the combination of logic circuits, analog circuits, and the like.

1-7. Advantageous Effects of First Embodiment

According to the first embodiment, the following advantageous effects can be provided.

(1a) Without the control for making the driving vibration amplitude constant, even when temperature change is caused in the element 3, the angular velocity detection result Dso with high accuracy can always be obtained.

For example, if the driving vibration amplitude increases due to the temperature change, the generated Coriolis force fc also increases. However, if the angular velocity is not changed, the ratio of the Coriolis force fc to the driving vibration amplitude does not change. Hence, even if the driving vibration amplitude changes due to the temperature change, if the angular velocity is not changed, Dc/Dm, which is a ratio of a value of the second detection signal Dc to a value of the first detection signal Dm, does not change. That is, the angular velocity detection result Dso output from the ratio calculation section 23 of the processing unit 11 does not change.

According to the gyro sensor apparatus 1 of the first embodiment described above, decrease in size can be achieved because a circuit for feedback control for making the driving vibration amplitude constant is not needed, and high accuracy can be achieved by which an angular velocity can be detected with high accuracy regardless of temperature change. In addition, using the result of the calculation Dc/Dm as the angular velocity detection result Dso is also effective against drift of power-supply voltage and production tolerance.

(1b) Even when a resonance frequency of the element 3 changes due to temperature change or the like, and the driving vibration velocity changes, resulting in the change in the driving vibration amplitude, if the angular velocity is not changed, the ratio of the Coriolis force fc to the driving vibration amplitude, that is, the angular velocity detection result Dso calculated by the processing unit 11 does not change. Hence, variation in the detection sensitivity according to the change in a resonance frequency of the element 3 can also be corrected.

(1c) The maximum driving vibration amplitude of the element 3 can be used. That is, an angular velocity can be detected with the maximum sensitivity of the element 3. Thus, an angular velocity can be detected with high sensitivity.

(1d) The processing unit 11 includes the first detection section 21 that outputs the first detection signal Dm based on the first vibration signal Vm, the second detection section 22 that outputs the second detection signal Dc based on the second vibration signal Vc, and the ratio calculation section 23 that calculates Dc/Dm as a ratio of the Coriolis force fc to the driving vibration amplitude. The processing unit 11 can be provided as a circuit, which is small in size and consumes little power, with low manufacturing cost by using recent standard electronic circuit technology.

(1e) The first detection section 21 is configured so as to output the first detection signal Dm by using the first pulse delay circuit 31 configured by the plurality of delay units 35 by which pulse propagation speed increases in proportion to a voltage value of the first vibration signal Vm. The second detection section 22 is also configured so as to output the second detection signal Dc by using the second pulse delay circuit 41 configured by the plurality of delay units 35 by which pulse propagation speed increases in proportion to a voltage value of the second vibration signal Vc. Thus, the first detection section 21 and the second detection section 22 can be configured by small scale digital circuits.

(1f) The first detection section 21 outputs a digital signal indicating the difference between Nm1, which is the number of the delay units 35 through which a pulse has passed during the high-side half period of the first vibration signal Vm, and Nm2, which is the number of the delay units 35 through which the pulse has passed during the low-side half period of the first vibration signal Vm, as the first detection signal Dm. Similarly, the second detection section 22 outputs a digital signal indicating the difference between Nc1, which is the number of the delay units 35 through which a pulse has passed during the high-side half period of the second vibration signal Vc, and Nc2, which is the number of the delay units 35 through which the pulse has passed during the low-side half period of the second vibration signal Vc, as the second detection signal Dc.

Hence, a value obtained by subtracting an integrated value during the low-side half period of the first vibration signal Vm from an integrated value during the high-side half period of the first vibration signal Vm can be assumed to be the first detection signal Dm. Similarly, a value obtained by subtracting an integrated value during the low-side half period of the second vibration signal Vc from an integrated value during the high-side half period of the second vibration signal Vc can be assumed to be the second detection signal Dc. Hence, even when noise is generated in the first vibration signal Vm, the influence of the noise on the first detection signal Dm can be suppressed. Similarly, even when noise is generated in the second vibration signal Vc, the influence of the noise on the second detection signal Dc can be suppressed. Thus, the accuracy in detecting an angular velocity can be prevented from lowering due to noise.

In the present embodiment, the driving signal generation circuit 5 corresponds to a driving section.

2. Second Embodiment

The descriptions of the configurations common to those of the first embodiment are omitted, and differences from the first embodiment will be mainly described. The reference numerals same as those of the first embodiment indicate the same components and signals. These are common to other embodiments described later.

2-1. Configuration

Figure 5:
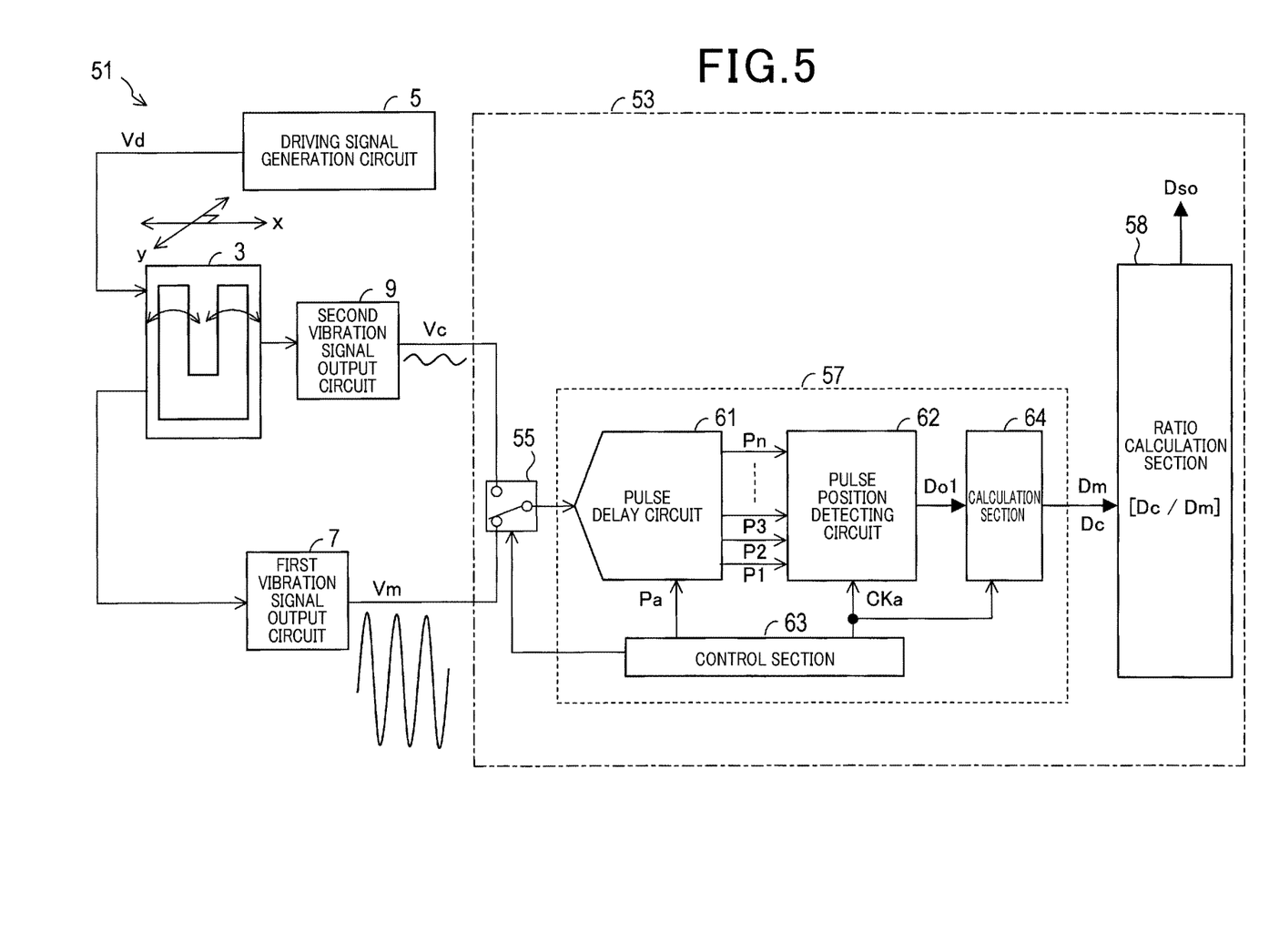
FIG. 5 is a block diagram showing a configuration of a gyro sensor apparatus according to a second embodiment.

As shown in FIG. 5, a gyro sensor apparatus 51 of the second embodiment differs from the gyro sensor apparatus of the first embodiment in that the gyro sensor apparatus 51 includes a processing unit 53 instead of the processing unit 11. The processing unit 53 has the same functions as those of the processing unit 11. The processing unit 53 includes a switch 55, a detection section 57, and a ratio calculation section 58.

The switch 55 receives the first vibration signal Vm and the second vibration signal Vc. The switch 55 selects and outputs one of the first vibration signal Vm and the second vibration signal Vc as a selection signal. The switch 55 is controlled by a control section 63 described later.

The detection section 57 includes a pulse delay circuit 61, a pulse position detecting circuit 62, a control section 63, and a calculation section 64.

The pulse delay circuit 61 has the same configuration as that of the first pulse delay circuit 31 of the first embodiment. It is noted that as power Vin of the delay units 35 in the pulse delay circuit 61, a selection signal is supplied from the switch 55. That is, the pulse delay circuit 61 performs A/D conversion for the selection signal.

The pulse position detecting circuit 62 has the same configuration as that of the first pulse position detecting circuit 32 of the first embodiment.

The control section 63 at least controls switching of the switch 55, outputs the pulse Pa to the pulse delay circuit 61, and outputs the clock CKa to the pulse position detecting circuit 62. The clock CKa is also input to the calculation section 64. Then, the calculation section 64 generates the first detection signal Dm and the second detection signal Dc from the output signal Do1 of the pulse position detecting circuit 62 and outputs the first detection signal Dm and the second detection signal Dc.

2-2. Operation of Control Section

The control section 63 performs the same operation as that of the first control section 33 of the first embodiment, that is, operations <m1> and <m2> in a state where the control section 63 makes the switch 55 output the first vibration signal Vm as a selection signal. This operation is referred to as first operation.

In addition, the control section 63 performs the same operation as that of the second control section 43 of the first embodiment, that is, operations <c1> and <c2> in a state where the control section 63 makes the switch 55 output the second vibration signal Vc as a selection signal. This operation is referred to as second operation. It is noted that the control section 63 performs the second operation, which is described in <c1> and <c2> of the first embodiment in a state where the word "pulse Pb" is changed to "pulse Pa", and the word "clock CKb" is changed to "clock CKa".

Then, the control section 63 performs the first operation and the second operation alternately, for example, at regular intervals or predetermined periods of the first vibration signal Vm.

2-3. Operation of Calculation Section

When the control section 63 performs the first operation, that is, when the first vibration signal Vm is output from the switch 55, the calculation section 64 performs the same operation as that of the first calculation section 34 of the first embodiment to generate and output the first detection signal Dm.

In addition, when the control section 63 performs the second operation, that is, when the second vibration signal Vc is output from the switch 55, the calculation section 64 performs the same operation as that of the second calculation section 44 of the first embodiment to generate and output the second detection signal Dc.

Hence, if the selection signal received from the switch 55 is the first vibration signal Vm, the detection section 57 outputs the first detection signal Dm indicating the amplitude of the first vibration signal Vm. In addition, if the selection signal received from the switch 55 is the second vibration signal Vc, the detection section 57 outputs the second detection signal Dc indicating the amplitude of the second vibration signal Vc (i.e. Coriolis force fc).

2-4. Operation of Ratio Calculation Section

The ratio calculation section 58 receives the first detection signal Dm and the second detection signal Dc from the detection section 57 and calculates a ratio of a value of the second detection signal Dc to a value of the first detection signal Dm, that is, Dc/Dm, as a ratio of Coriolis force to the driving vibration velocity. The ratio calculation section 58 outputs the calculated ratio as the angular velocity detection result Dso.

2-5. Advantageous Effects of Second Embodiment

Also according to the second embodiment, advantageous effects similar to those of the first embodiment can be provided. In addition, compared to the first embodiment, one of the two detection sections can be removed. Thus, the gyro sensor apparatus can be further decreased in size. In the second embodiment, the switch 55 corresponds to a switch section.

3. Third Embodiment

3-1. Configuration

Figure 6:
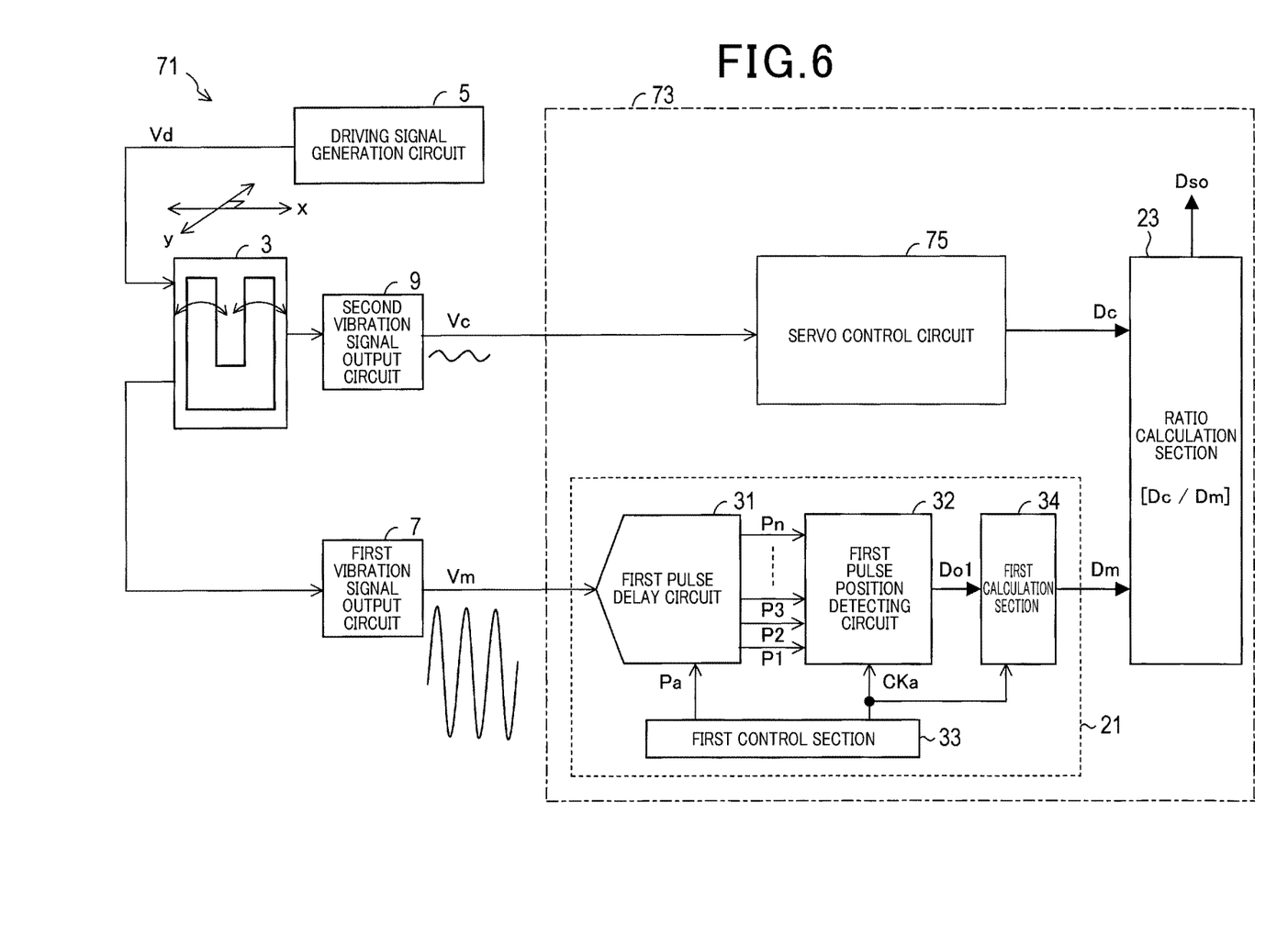
FIG. 6 is a block diagram showing a configuration of a gyro sensor apparatus according to a third embodiment.

As shown in FIG. 6, a gyro sensor apparatus 71 of the third embodiment differs from the gyro sensor apparatus of the first embodiment in that a servo control circuit 75 is provided instead of the second detection section 22.

The servo control circuit 75 performs servo control for the element 3 to make the amount of displacement of the element 3 in the direction of the Coriolis force fc zero, and outputs a digital signal indicating the controlled variable of the servo control as the second detection signal Dc. Since the controlled variable of servo control is proportional to the Coriolis force fc, the second detection signal Dc output from the servo control circuit 75 is a signal indicating the Coriolis force fc. Such a servo control circuit is disclosed in, for example, JP-A-2011-137777 and JP-A-2015-52484.

The servo control circuit 75 may be configured, for example, so as to output a digital signal obtained by multiplying the controlled variable of servo control by a predetermined constant, as the second detection signal Dc.

3-2. Advantageous Effects of Third Embodiment

Also according to the third embodiment, the advantageous effects (1a) to (1c) described in the first embodiment can be provided. In addition, in the third embodiment, the servo control circuit 75 corresponds to a second section and can also provide the advantageous effects described in (1d). Regarding the first detection section 21, as described in the first embodiment, the advantageous effects (1e) and (1f) can be obtained.

Other Embodiments

It will be appreciated that the present invention is not limited to the configurations described above, but any and all modifications, variations or equivalents, which may occur to those who are skilled in the art, should be considered to fall within the scope of the present invention.

Another Embodiment 1

For example, in the first embodiment, the first pulse delay circuit 31 of the first detection section 21 may be a ring pulse delay circuit in which the pulse Pa is circulated. In this case, for example, the first-stage delay unit 35 may be an AND gate circuit, and one of the input terminals of the AND gate circuit may be an input terminal for the pulse Pa. In addition, the other of the input terminals of the AND gate circuit may be connected to an output terminal of the last-stage delay unit 35.

Then, if the first pulse delay circuit 31 is a ring pulse delay circuit, a counter for counting the number of circulations of a pulse in the ring pulse delay circuit may be provided, and a data output circuit described later may be provided instead of the first pulse position detecting circuit 32.

The data output circuit acquires a delay pulse group of the ring pulse delay circuit and a count value of the counter as input information every time when the clock CKa rises. Then, the data output circuit outputs a digital signal indicating the number of the delay units 35, through which the pulse Pa has passed from the start time of the pulse Pa, based on the acquired input information.

It is noted that a circuit including the ring pulse delay circuit, the counter, and the data output circuit described above is referred to as a time A/D conversion circuit, and is disclosed in, for example, JP-A-2005-102129 and JP-A-5-259907. In addition, JP-A-2005-102129 discloses a configuration including a latch and encoder and a latch circuit as the configuration of the data output circuit.

That is, the first detection section 21 may be configured by using a time A/D conversion circuit including a ring pulse delay circuit. Similarly, the second detection section 22 of the first embodiment, the detection section 57 of the second embodiment, and the first detection section 21 of the third embodiment may be each configured by using a time A/D conversion circuit including a ring pulse delay circuit.

Another Embodiment 2

The delay units 35 configuring a pulse delay circuit may be configured by, other than the inverter gate circuits 36, for example, a gate circuit used in digital circuits such as a NAND gate circuit, a NOR gate circuit, an AND gate circuit, and an OR gate circuit. Alternatively, the delay units 35 may be configured by using delay elements used in an analog circuit.

Another Embodiment 3

Although the ratio calculation sections 23 and 58 are configured so as to calculate the ratio described above by digital signal processing, the ratio calculation sections 23 and 58 may be configured so as to calculate the ratio by analog signal processing.

Another Embodiment 4

The first detection section 21 may include an AD conversion circuit without using the pulse delay circuit to output the first detection signal Dm by using the A/D conversion circuit. This configuration may be applied to the second detection section 22 and the detection section 57.

(Others)

A plurality of functions of one component of the above embodiments may be provided by a plurality of components, or one function of one component may be provided by a plurality of components. A plurality of functions of a plurality of components may be provided by one component. One function provided by a plurality of components may be provided by one component. Part of the configurations of the above embodiments may be omitted. At least part of the configuration of one embodiment may be added to or replaced with the configuration of another embodiment. In addition to the gyro sensor apparatus described above, various embodiments may be provided such as a system including the gyro sensor apparatus as a component, a program allowing a computer to function as the gyro sensor apparatus, a non-transitory computer readable recording medium such as a semiconductor memory storing the program, and a method of processing a gyro sensor signal.

Hereinafter, an aspect of the above-described embodiments will be summarized.

As an aspect of the embodiment, a gyro sensor apparatus is provided which includes a driving section (5) and a processing unit (11, 53, 73).

The driving section (5) supplies a driving signal, which is for vibrating a sensing element (3) of a vibration-type gyro sensor in a drive axis direction, to the sensing element.

The processing unit receives a first vibration signal and a second vibration signal. The first vibration signal has an amplitude proportional to a driving vibration amplitude, which is an amplitude of vibration in the drive axis direction of the sensing element. The second vibration signal has an amplitude proportional to Coriolis force generated in the sensing element due to an angular velocity of the sensing element. The processing unit calculates a ratio of Coriolis force to the driving vibration amplitude based on the first vibration signal and the second vibration signal and outputs a result of the calculation as a result of detection of the angular velocity of the sensing element.

According to the gyro sensor apparatus, even when the driving vibration amplitude changes due to temperature change, in other words, even when the driving vibration velocity changes, a detection result of an angular velocity with high accuracy can be obtained without performing feedback control for making the driving vibration amplitude constant. That is, when the driving vibration amplitude changes due to temperature change, generated Coriolis force changes. However, if the angular velocity is not changed, since a ratio of Coriolis force to the driving vibration amplitude is used, the detection result of the angular velocity calculated by the processing unit is not changed.

Hence, decrease in size can be achieved because a circuit for the feedback control is not needed, and high accuracy can be achieved by which an angular velocity can be detected with high accuracy regardless of temperature change.

In addition, even when a resonance frequency of the sensing element changes due to temperature change or the like, and the driving vibration velocity changes, resulting in the change in the driving vibration amplitude, if the angular velocity is not changed, the ratio of the Coriolis force to the driving vibration amplitude, that is, the detection result of the angular velocity calculated by the processing unit does not change. Hence, variation in the detection sensitivity according to the change in a resonance frequency of the sensing element can also be corrected.

Furthermore, the maximum driving vibration amplitude of the sensing element can be used. Thus, an angular velocity can be detected with high sensitivity.

What is claimed is:

1. A gyro sensor apparatus comprising:
a driving section that supplies a driving signal, which is for vibrating a sensing element of a vibration-type gyro sensor in a drive axis direction, to the sensing element; and
a processing unit that receives a first vibration signal having an amplitude proportional to a driving vibration amplitude, which is an amplitude of vibration in the drive axis direction of the sensing element and a second vibration signal having an amplitude proportional to Coriolis force generated in the sensing element due to an angular velocity of the sensing element, wherein
the processing unit is configured to calculate a ratio of Coriolis force to the driving vibration amplitude based on the first vibration signal and the second vibration signal and output a result of the calculation as a result of detection of the angular velocity of the sensing element,
wherein the processing unit includes:
a first detection section that is configured to output a first detection signal indicating the driving vibration amplitude based on the first vibration signal,
a second detection section that is configured to output a second detection signal indicating the Coriolis force based on the second vibration signal, and
a ratio calculation section that is configured to receive the first detection signal and the second detection signal to calculate a ratio of a value of the second detection signal to a value of the first detection signal as a ratio of the Coriolis force to the driving vibration amplitude,
wherein the first detection section includes a first pulse delay circuit in which a plurality of delay units configured so that speed, at which a received pulse signal is propagated to an output side, increases in proportion to a voltage value of the first vibration signal, are connected in series, and is configured to output the first detection signal by using the first pulse delay circuit, and the second detection section includes a second pulse delay circuit in which a plurality of delay units configured so that speed, at which a received pulse signal is propagated to an output side, increases in proportion to a voltage value of the second vibration signal, are connected in series, and is configured to output the second detection signal by using the second pulse delay circuit, wherein the first detection section is configured to output, as the first detection signal, a digital signal indicating a difference between the number of the delay units through which the pulse signal has passed in the first pulse delay circuit during a half period during which the first vibration signal is larger than an oscillation center voltage of the first vibration signal, and the number of the delay units through which the pulse signal has passed in the first pulse delay circuit during a half period during which the first vibration signal is smaller than the oscillation center voltage of the first vibration signal, and the second detection section is configured to output, as the second detection signal, a digital signal indicating a difference between the number of the delay units through which the pulse signal has passed in the second pulse delay circuit during a half period during which the second vibration signal is larger than an oscillation center voltage of the second vibration signal, and the number of the delay units through which the pulse signal has passed in the second pulse delay circuit during a half period during which the second vibration signal is smaller than the oscillation center voltage of the second vibration signal.

* * * * *